(12) United States Patent
Wu et al.

(10) Patent No.: US 12,613,433 B2
(45) Date of Patent: Apr. 28, 2026

(54) CONTACT LENS DEVICE AND COMMUNICATION METHOD

(71) Applicant: HTC Corporation, Taoyuan City (TW)

(72) Inventors: Chun-Yih Wu, Taoyuan City (TW);
Ta-Chun Pu, Taoyuan City (TW);
Yen-Liang Kuo, Taoyuan City (TW)

(73) Assignee: HTC Corporation, Taoyuan City (TW)

( * ) Notice: Subject to any disclaimer, the term of this patent is extended or adjusted under 35 U.S.C. 154(b) by 312 days.

(21) Appl. No.: 18/599,820

(22) Filed: Mar. 8, 2024

(65) Prior Publication Data

US 2025/0208440 A1     Jun. 26, 2025

(30) Foreign Application Priority Data

Dec. 25, 2023    (TW) ................................. 112150535

(51) Int. Cl.
| | |
|---|---|
| *G02C 7/04* | (2006.01) |
| *G01R 1/07* | (2006.01) |
| *G02B 1/04* | (2006.01) |
| *G02C 7/08* | (2006.01) |
| *G02C 11/00* | (2006.01) |
| *G02C 11/04* | (2006.01) |

(52) U.S. Cl.
CPC ............. *G02C 7/083* (2013.01); *G01R 1/071* (2013.01); *G02B 1/043* (2013.01); *G02C 7/049* (2013.01); *G02C 11/04* (2013.01); *G02C 11/10* (2013.01); *G02C 2202/18* (2013.01)

(58) Field of Classification Search
CPC .......... G02C 7/083; G02C 7/049; G02C 7/04; G02C 11/04; G02C 11/10; G02C 2202/18; G01R 1/071; G02B 1/043

USPC ...................................................... 351/159.39
See application file for complete search history.

(56) References Cited

U.S. PATENT DOCUMENTS

| | | | | |
|---|---|---|---|---|
| 7,907,895 | B2 * | 3/2011 | Shinagawa ............. | G06F 1/163 |
| | | | | 600/11 |
| 9,332,935 | B2 * | 5/2016 | Etzkorn ................. | A61B 5/682 |
| 10,010,270 | B2 * | 7/2018 | Pletcher ............... | A61B 5/6821 |
| 2005/0244166 | A1 * | 11/2005 | Shinagawa ............. | G06F 3/041 |
| | | | | 398/186 |
| 2014/0081178 | A1 * | 3/2014 | Pletcher ................... | A61B 3/10 |
| | | | | 600/595 |

(Continued)

*Primary Examiner* — William R Alexander
(74) *Attorney, Agent, or Firm* — Birch, Stewart, Kolasch & Birch, LLP

(57) ABSTRACT

A contact lens device includes a hydrogel substrate, a first conductive element, a second conductive element, an EO (Electro-Optical) crystal element, a light source, a light waveguide, a light sensor, and a processor. The first conductive element is disposed on the hydrogel substrate. The second conductive element is disposed on the hydrogel substrate. The EO crystal element is disposed between the first conductive element and the second conductive element. The EO crystal element is affected by a human electric field. The light source transmits an incident light signal. The EO crystal element transmits back a reflected light signal according to the incident light signal. The light waveguide respectively guides the incident light signal and the reflected light signal. The light sensor receives the reflected light signal from the light waveguide. The processor can obtain the relative information of the human electric field according to the reflected light signal.

20 Claims, 7 Drawing Sheets

100

(56) References Cited

U.S. PATENT DOCUMENTS

| | | | | |
|---|---|---|---|---|
| 2014/0371559 | A1* | 12/2014 | Etzkorn | G02C 7/04 |
| | | | | 156/212 |
| 2015/0324692 | A1* | 11/2015 | Ritchey | G06N 20/00 |
| | | | | 348/36 |
| 2017/0061034 | A1* | 3/2017 | Ritchey | G09G 5/026 |
| 2017/0338484 | A1* | 11/2017 | Liu | H01M 12/08 |
| 2018/0271408 | A1* | 9/2018 | Pletcher | A61B 5/1103 |
| 2021/0375230 | A1* | 12/2021 | Rakshit | G09G 3/38 |
| 2022/0171218 | A1* | 6/2022 | Sakuma | H10N 30/30 |
| 2023/0375525 | A1* | 11/2023 | Merritt | G01J 3/021 |
| 2024/0393593 | A1* | 11/2024 | Shtukater | G02C 11/10 |

* cited by examiner

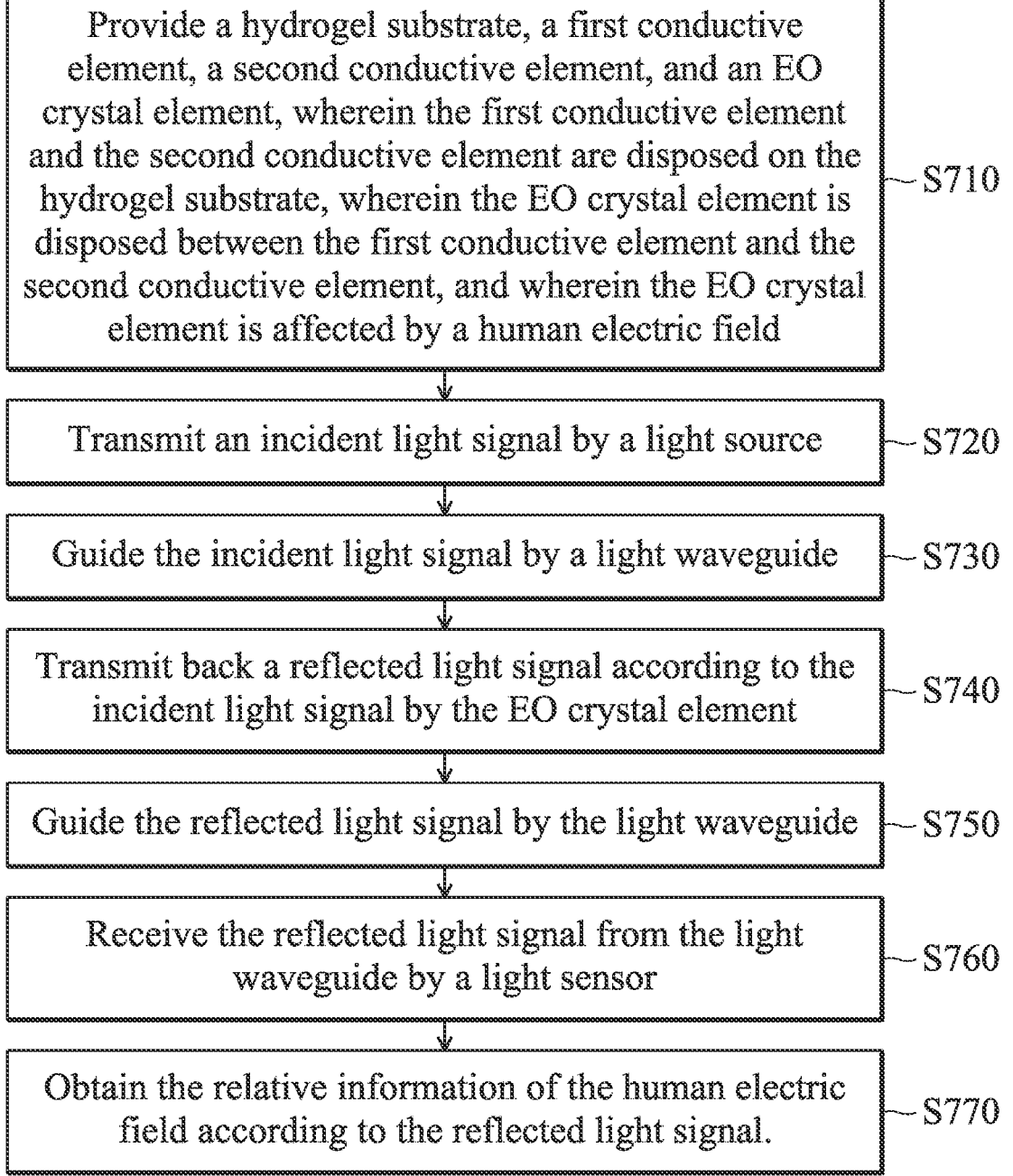

Provide a hydrogel substrate, a first conductive element, a second conductive element, and an EO crystal element, wherein the first conductive element and the second conductive element are disposed on the hydrogel substrate, wherein the EO crystal element is disposed between the first conductive element and the second conductive element, and wherein the EO crystal element is affected by a human electric field ~S710

Transmit an incident light signal by a light source ~S720

Guide the incident light signal by a light waveguide ~S730

Transmit back a reflected light signal according to the incident light signal by the EO crystal element ~S740

Guide the reflected light signal by the light waveguide ~S750

Receive the reflected light signal from the light waveguide by a light sensor ~S760

Obtain the relative information of the human electric field according to the reflected light signal. ~S770

FIG. 7

CONTACT LENS DEVICE AND COMMUNICATION METHOD

CROSS REFERENCE TO RELATED APPLICATIONS

This application claims priority of Taiwan Patent Application No. 112150535 filed on Dec. 25, 2023, the entirety of which is incorporated by reference herein.

BACKGROUND OF THE INVENTION

Field of the Invention

The invention relates to a contact lens device, and more particularly, to a contact lens device and a communication method.

Description of the Related Art

Physiological signal detection devices are commonly used. However, the detection accuracy of a conventional physiological signal detection device is usually not high enough to be used in the field of VR (Virtual Reality) or AR (Augmented Reality). Accordingly, there is a need to propose a novel solution for solving the problem of the prior art.

BRIEF SUMMARY OF THE INVENTION

In an exemplary embodiment, the invention is directed to a contact lens device that includes a hydrogel substrate, a first conductive element, a second conductive element, an EO (Electro-Optical) crystal element, a light source, a light waveguide, a light sensor, and a processor. The first conductive element is disposed on the hydrogel substrate. The second conductive element is disposed on the hydrogel substrate. The EO crystal element is disposed between the first conductive element and the second conductive element. The EO crystal element is affected by a human electric field. The light source transmits an incident light signal. The EO crystal element transmits back a reflected light signal according to the incident light signal. The light waveguide respectively guides the incident light signal and the reflected light signal. The light sensor receives the reflected light signal from the light waveguide. The processor is coupled to the light sensor. The processor can obtain the relative information of the human electric field according to the reflected light signal.

In some embodiments, the first conductive element is surrounded by the second conductive element.

In some embodiments, the first conductive element substantially has a circular shape.

In some embodiments, the second conductive element substantially has a donut shape.

In some embodiments, the area of the first conductive element is greater than the area of the second conductive element.

In some embodiments, the light source, the light waveguide, the light sensor, and the processor are integrated with the first conductive element.

In some embodiments, the operational frequency of the human electric field is from 10 MHz to 100 MHz.

In some embodiments, the refractive index of the EO crystal element is changed according to the human electric field.

In some embodiments, the EO crystal element is made of a lithium niobate material, a lithium tantalate material, or a barium borate material.

In some embodiments, the light source is an LED (Light-Emitting Diode).

In some embodiments, the contact lens device further includes an RF (Radio Frequency) transceiver for receiving or transmitting an RF signal. The RF transceiver is coupled to the processor, and is integrated with the first conductive element. The processor can obtain the physiological information of a human body according to the RF signal.

In some embodiments, if a glucose eye drop falls on the contact lens device, the glucose eye drop will provide electric power for the light source, the light waveguide, the light sensor, and the processor.

In some embodiments, the concentration of the glucose eye drop is greater than or equal to 20 mM.

In another exemplary embodiment, the invention is directed to a communication method that includes the steps of: providing a hydrogel substrate, a first conductive element, a second conductive element, and an EO crystal element, wherein the first conductive element and the second conductive element are disposed on the hydrogel substrate, wherein the EO crystal element is disposed between the first conductive element and the second conductive element, and wherein the EO crystal element is affected by a human electric field; transmitting an incident light signal by a light source; guiding the incident light signal by a light waveguide; transmitting back a reflected light signal according to the incident light signal by the EO crystal element; guiding the reflected light signal by the light waveguide; receiving the reflected light signal from the light waveguide by a light sensor; and obtaining relative information of the human electric field according to the reflected light signal.

In some embodiments, the communication method further includes: integrating the light source, the light waveguide, and the light sensor with the first conductive element.

In some embodiments, the communication method further includes: changing the refractive index of the EO crystal element according to the human electric field.

In some embodiments, the communication method further includes: receiving or transmitting an RF signal by an RF transceiver. The RF transceiver is integrated with the first conductive element.

In some embodiments, the communication method further includes: obtaining the physiological information of a human body according to the RF signal.

In some embodiments, the communication method further includes: providing electric power for the light source, the light waveguide, and the light sensor by a glucose eye drop.

BRIEF DESCRIPTION OF DRAWINGS

The invention can be more fully understood by reading the subsequent detailed description and examples with references made to the accompanying drawings, wherein:

FIG. 7 is a flowchart of a communication method according to an embodiment of the invention.

DETAILED DESCRIPTION OF THE INVENTION

Figure 1:
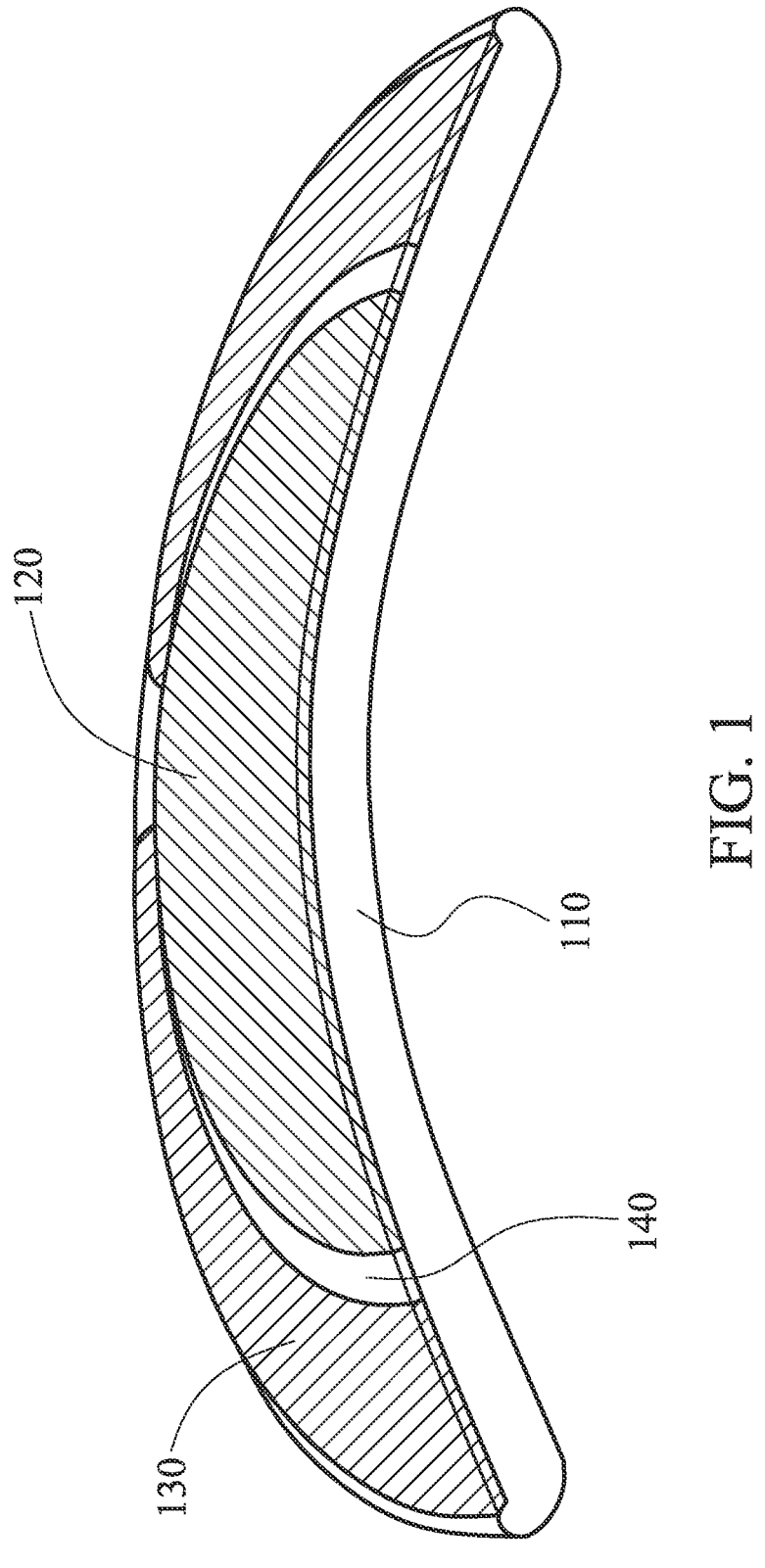
FIG. 1 is a perspective view of a contact lens device according to an embodiment of the invention.

In order to illustrate the foregoing and other purposes, features and advantages of the invention, the embodiments and figures of the invention will be described in detail as follows.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". The term "substantially" means the value is within an acceptable error range. One skilled in the art can solve the technical problem within a predetermined error range and achieve the proposed technical performance. Also, the term "couple" is intended to mean either an indirect or direct electrical connection. Accordingly, if one device is coupled to another device, that connection may be through a direct electrical connection, or through an indirect electrical connection via other devices and connections.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
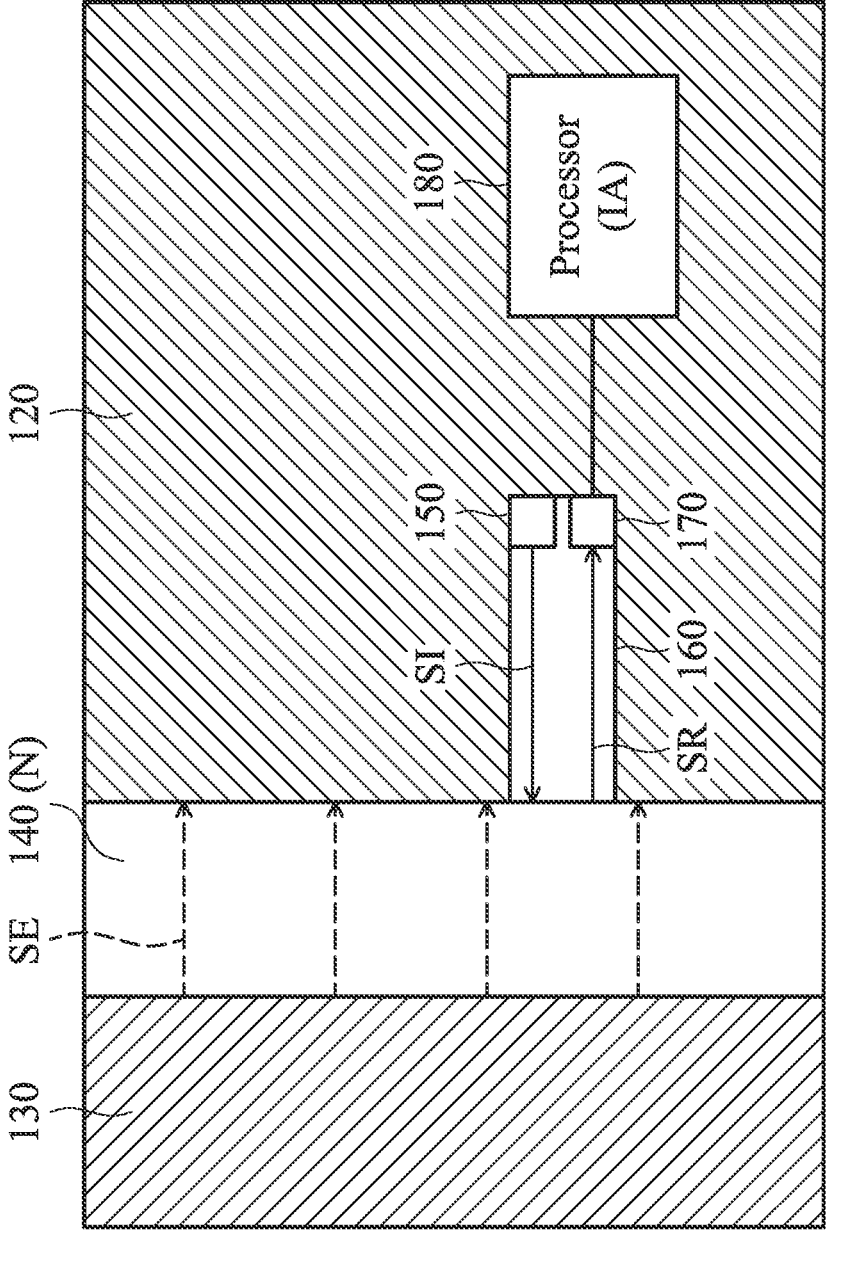
FIG. 2 is a partial sectional view of a contact lens device according to an embodiment of the invention.

FIG. 1 is a perspective view of a contact lens device 100 according to an embodiment of the invention. FIG. 2 is a partial sectional view of the contact lens device 100 according to an embodiment of the invention. Please refer to FIG. 1 and FIG. 2 together. For example, the contact lens device 100 may have the function of wireless communication, which may be applied to the field of VR (Virtual Reality) or AR (Augmented Reality), but it is not limited thereto. As shown in FIG. 1 and FIG. 2, the contact lens device 100 includes a hydrogel substrate 110, a first conductive element 120, a second conductive element 130, an EO (Electro-Optical) crystal element 140, a light source 150, a light waveguide 160, a light sensor (or a photodetector) 170, and a processor 180. It should be understood that the contact lens device 100 may further include other components, such as a power supply module, although they are not displayed in FIG. 1.

The hydrogel substrate 110 is considered as a transparent substrate of the contact lens device 100. The shape and type of the hydrogel substrate 110 are not limited in the invention. In some embodiments, the hydrogel substrate 110 is used as a concave lens element. In alternative embodiments, the hydrogel substrate 110 is used as a convex lens element.

The first conductive element 120 may be made of a transparent conductive material, such as an ITO (Indium Tin Oxide) material. The first conductive element 120 is disposed on the hydrogel substrate 110. The first conductive element 120 may substantially have a circular shape. In some embodiments, the area of the first conductive element 120 is greater than the area of the second conductive element 130. Thus, the first conductive element 120 is configured to accommodate a variety of electronic components.

The second conductive element 130 may be made of another transparent conductive material. The second conductive element 130 may be completely separate from the first conductive element 120. The second conductive element 120 is disposed on the hydrogel substrate 110. The second conductive element 130 may substantially have a donut shape. In some embodiments, the first conductive element 120 is completely surrounded by the second conductive element 130.

The EO crystal element 140 is disposed between the first conductive element 120 and the second conductive element 130. The EO crystal element 140 may be carried by the hydrogel substrate 110. It should be noted that the EO crystal element 140 is affected by a human electric field SE. The human electric field SE may come from a human body (not shown). For example, the human electric field SE may be naturally generated by the human body. Alternatively, when an HBC (Human Body Communication) TX (Transmitter) transmit an HBC signal to the human body, the human body can generate the human electric field SE in response to the HBC signal, but it is not limited thereto. For example, the EO crystal element 140 may be affected by the human electric field SE, which may be generated by at least one external electric field source (not shown) coupled to the human body. In some embodiments, the operational frequency of the human electric field SE is from 10 MHz to 100 MHz. In addition, the human electric field SE may be formed between the first conductive element 120 and the second conductive element 130, and the direction of its electric field may be alternatively changed.

The EO crystal element 140 may be made of a lithium niobate ($LiNbO_3$) material, a lithium tantalate ($LiTaO_3$) material, or a barium borate ($Ba(BO_2)_2$) material. In some embodiments, the refractive index N of the EO crystal element 140 is changed according to the human electric field SE. For example, the value of the aforementioned refractive index N may be substantially proportional to the strength of the human electric field SE, but it is not limited thereto.

In some embodiments, the light source 150, the light waveguide 160, the light sensor 170, and the processor 180 are all integrated with the first conductive element 120. For example, the light source 150, the light waveguide 160, the light sensor 170, and the processor 180 may all be disposed on the first conductive element 120. Alternatively, the light source 150, the light waveguide 160, the light sensor 170, and the processor 180 may all be embedded in the first conductive element 120, but they are not limited thereto.

The light source 150 transmits an incident light signal SI. For example, the light source 150 may be an LED (Light-Emitting Diode), but it is not limited thereto.

The light waveguide 160 is respectively adjacent to the EO crystal element 140 and the light source 150. The light waveguide 160 guides the incident light signal SI from the light source 150 to the EO crystal element 140. In response, the EO crystal element 140 transmits back a reflected light signal SR according to the incident light signal SI. Then, the light waveguide 160 guides the reflected light signal SR from the EO crystal element 140 to the light sensor 170. For example, the light waveguide 160 may be a Fabry-Perot waveguide, but it is not limited thereto. In some embodiments, the incident light signal SI and the reflected light signal SR substantially have opposite transmission directions in the light waveguide 160. It should be noted that the term "adjacent" or "close" over the disclosure means that the distance (spacing) between two corresponding elements is smaller than a predetermined distance (e.g., 10 mm or the shorter), or mean that the two corresponding elements directly touch each other (i.e., the aforementioned distance/spacing between them is reduced to 0).

The light sensor 170 receives the reflected light signal SR from the light waveguide 160. The processor 180 is coupled to the light sensor 170. It should be noted that the processor 180 can obtain the relative information IA of the human electric field SE according to the reflected light signal SR.

Generally, since the refractive index N of the EO crystal element 140 is changed according to the human electric field SE, the optical characteristics of the reflected light signal SR is indirectly determined by the human electric field SE. Finally, the processor 180 can accurately estimate the relative information IA of the human electric field SE by analyzing the reflected light signal SR. For example, the aforementioned relative information IA may include a heart rate and a respiratory rate, but it is not limited thereto. That is, with the design of the invention, the proposed contact lens device 100 can easily collect a variety of state information of the human body, and it can also significantly improve the overall detection accuracy.

The following embodiments will introduce different configurations and detail structural features of the contact lens device 100. It should be understood that these figures and descriptions are merely exemplary, rather than limitations of the invention.

Figure 3:
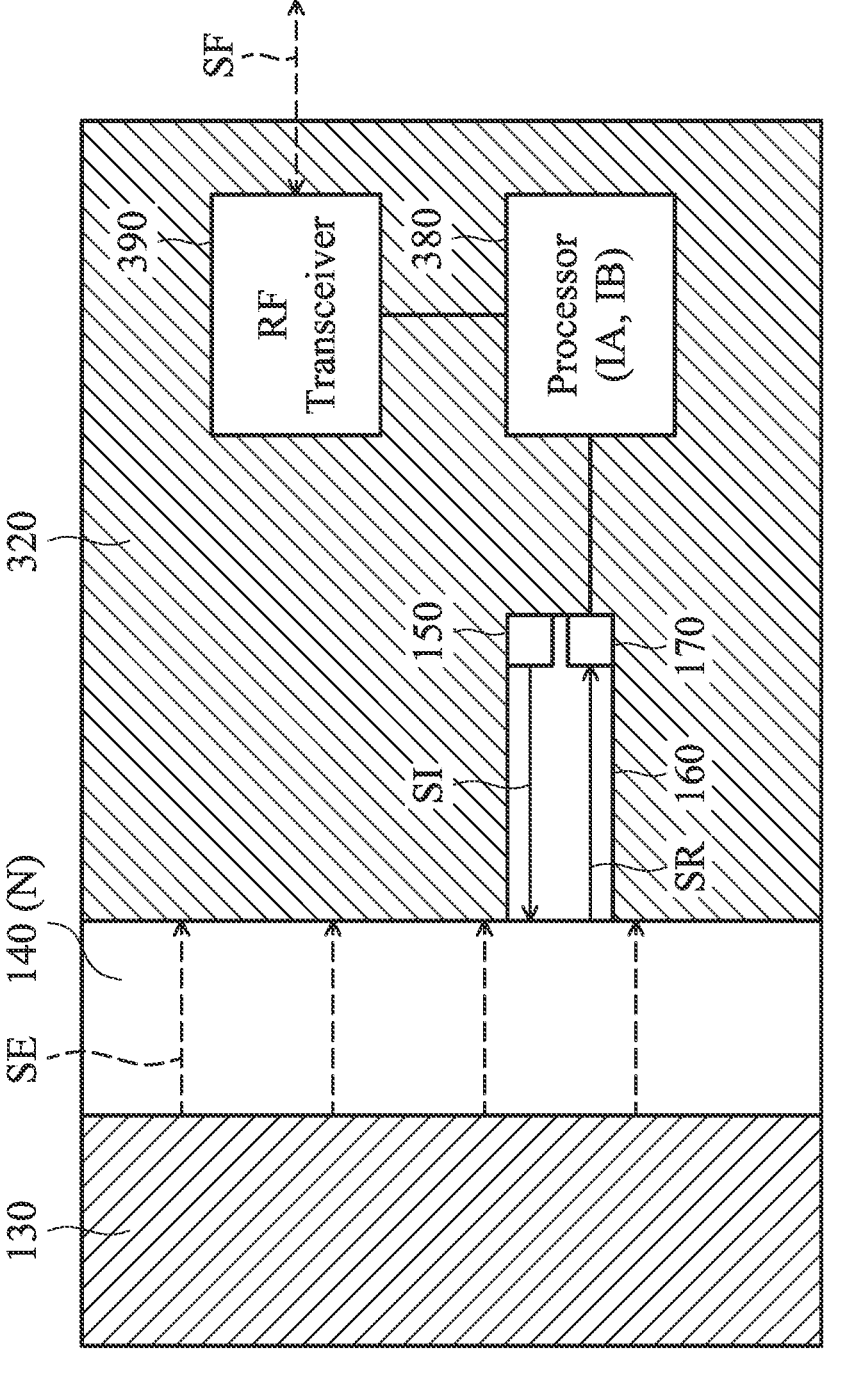
FIG. 3 is a partial sectional view of a contact lens device according to an embodiment of the invention.

FIG. 3 is a partial sectional view of a contact lens device 300 according to an embodiment of the invention. FIG. 3 is similar to FIG. 1 and FIG. 2. In the embodiment of FIG. 3, the contact lens device 300 further includes an RF (Radio Frequency) transceiver 390. The RF transceiver 390 is integrated with a first conductive element 320 of the contact lens device 300. The RF transceiver 390 receives or transmits an RF signal SF. Also, the RF transceiver 390 is coupled to a processor 380 of the contact lens device 300. The processor 380 can obtain the physiological information IB of the human body according to the RF signal SF. With such a design, the contact lens device 300 can provide the functions of both EO detection and RF detection. Other features of the contact lens device 300 of FIG. 3 are similar to those of the contact lens device 100 of FIG. 1 and FIG. 2. Therefore, the two embodiments can achieve similar levels of performance.

Figure 4:
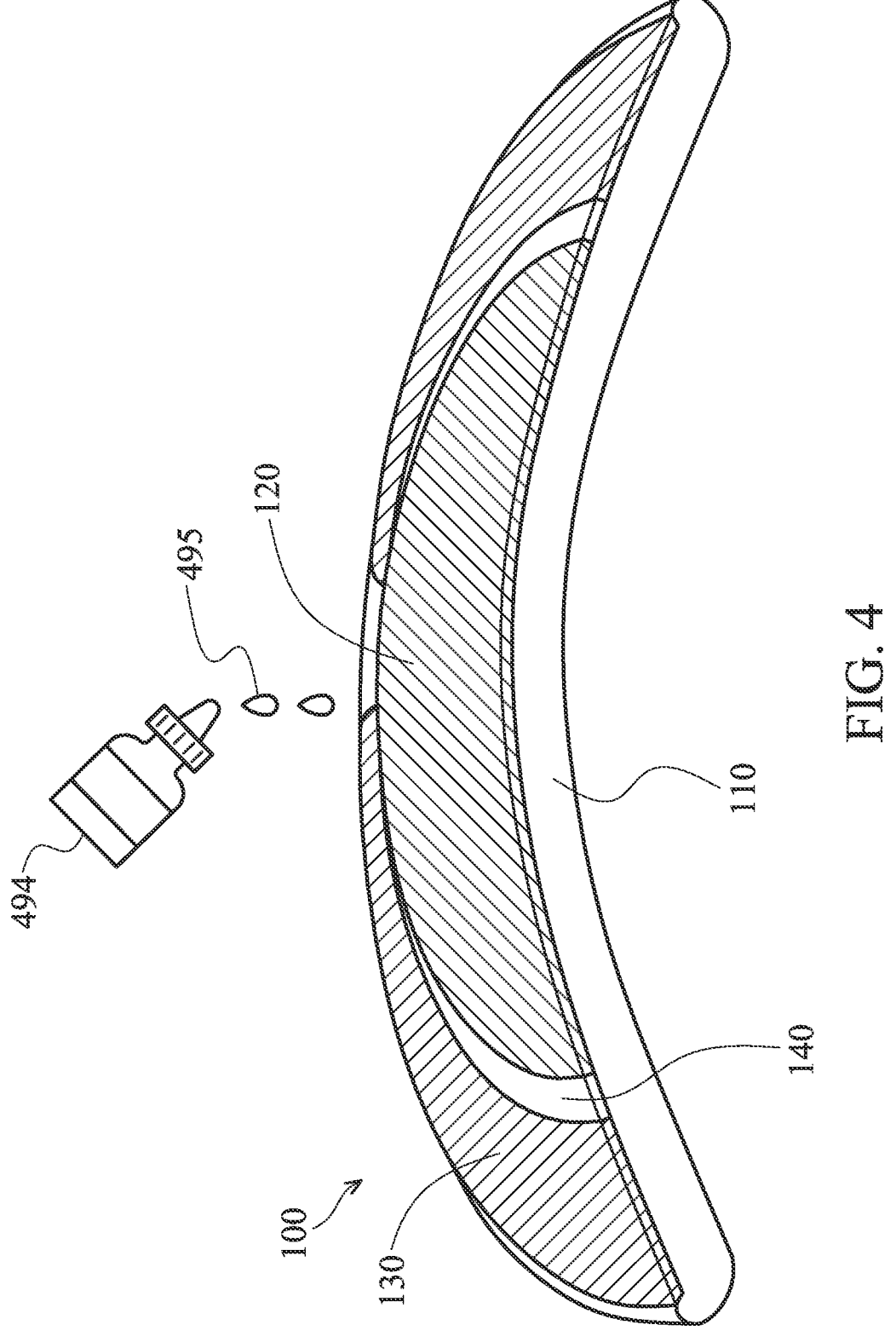
FIG. 4 is a perspective view of a contact lens device according to another embodiment of the invention.

FIG. 4 is a perspective view of the contact lens device 100 according to another embodiment of the invention. In the embodiment of FIG. 4, an eye drops bottle 494 is configured to store glucose eye drops. If a glucose eye drop 495 in the eye drops bottle 494 falls on the contact lens device 100, the glucose eye drop 495 can provide electric power for a light source, a light waveguide, a light sensor, a the processor, and an RF transceiver (not shown) of the contact lens device 100. It should be noted that the concentration of the glucose eye drop 495 is greater than or equal to 20 mM.

Figure 5:
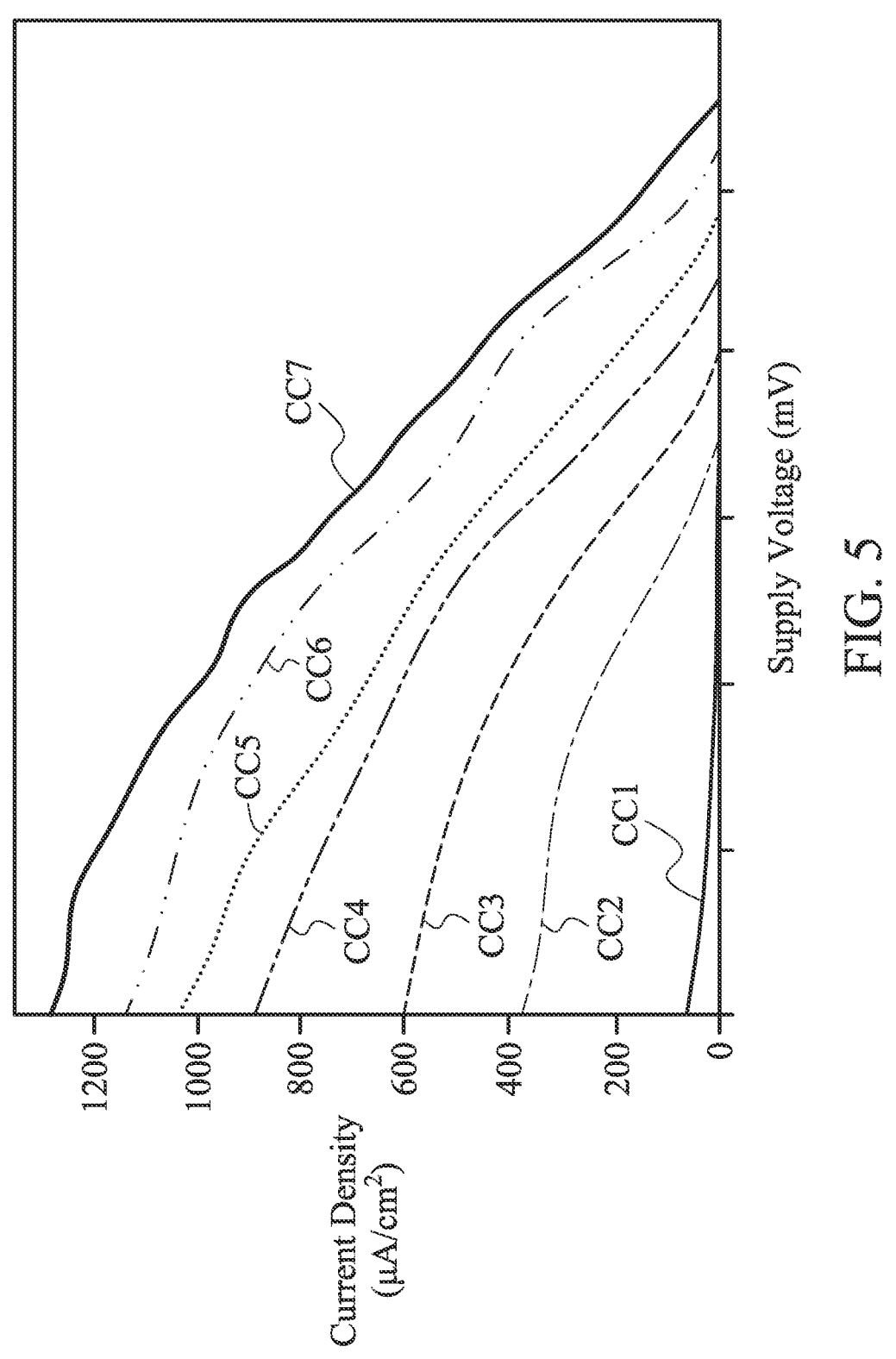
FIG. 5 is a diagram of current density of a contact lens device supplied by a glucose eye drop at different concentrations according to an embodiment of the invention.
Figure 6:
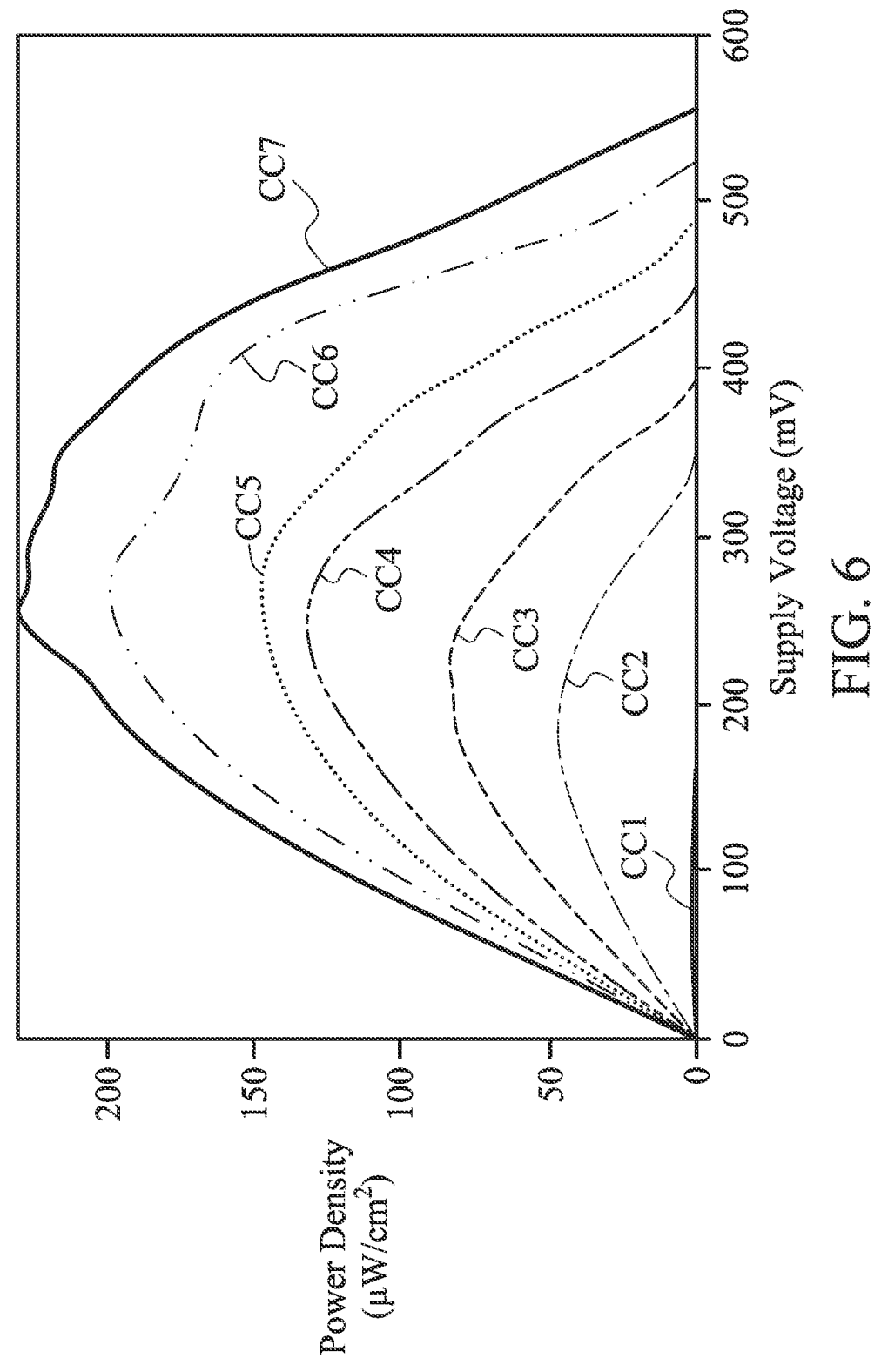
FIG. 6 is a diagram of power density of a contact lens device supplied by a glucose eye drop at different concentrations according to an embodiment of the invention.

FIG. 5 is a diagram of current density of the contact lens device 100 supplied by the glucose eye drop 495 at different concentrations according to an embodiment of the invention. The horizontal axis represents supply voltage (mV), and the vertical axis represents current density ($\mu$A/cm$^2$). FIG. 6 is a diagram of power density of the contact lens device 100 supplied by the glucose eye drop 495 at different concentrations according to an embodiment of the invention. The horizontal axis represents the supply voltage (mV), and the vertical axis represents the power density ($\mu$W/cm$^2$).

As shown in FIG. 5 and FIG. 6, a first curve CC1 represents the supply characteristics of the glucose eye drop 495 at a concentration of 0 mM, a second curve CC2 represents the supply characteristics of the glucose eye drop 495 at a concentration of 3 mM, a third curve CC3 represents the supply characteristics of the glucose eye drop 495 at a concentration of 5 mM, a fourth curve CC4 represents the supply characteristics of the glucose eye drop 495 at a concentration of 7 mM, a fifth curve CC5 represents the supply characteristics of the glucose eye drop 495 at a concentration of 10 mM, a sixth curve CC6 represents the supply characteristics of the glucose eye drop 495 at a concentration of 15 mM, and a seventh curve CC7 represents the supply characteristics of the glucose eye drop 495 at a concentration of 20 mM.

According to the measurements of FIG. 5 and FIG. 6, when the concentration of the glucose eye drop 495 is greater than or equal to 20 mM, it corresponding supply voltage at the maximum power density can reach about 300 mV. Such a supply voltage can provide sufficient bioelectricity for all active elements disposed in the contact lens device 100. With the proposed design, the contact lens device 100 can be charged without additionally using NFC (Near-Field Communication) technology, so as to increase the overall ease of use. In some embodiments, the glucose eye drop 495 continuously falls on the contact lens device 100 at intervals of about 1 hour, but it is not limited thereto.

FIG. 7 is a flowchart of a communication method according to an embodiment of the invention. The communication method may be applied in a contact lens device. To begin, in step S710, a hydrogel substrate, a first conductive element, a second conductive element, and an EO crystal element are provided. The first conductive element and the second conductive element are disposed on the hydrogel substrate. The EO crystal element is disposed between the first conductive element and the second conductive element. The EO crystal element is affected by a human electric field. In step S720, an incident light signal is transmitted by a light source. In step S730, the incident light signal is guided by a light waveguide. In step S740, a reflected light signal is transmitted back according to the incident light signal by the EO crystal element. In step S750, the reflected light signal is guided by the light waveguide. In step S760, the reflected light signal is received from the light waveguide by a light sensor. Finally, in step S770, the relative information of the human electric field is obtained according to the reflected light signal. It should be understood that these steps are not required to be performed in order, and every feature of the embodiments of FIGS. 1 to 6 may be applied to the communication method of FIG. 7.

The invention proposes a novel contact lens device and a novel communication method thereof. In comparison to the conventional design, the invention has at least the advantages of increasing the overall detection accuracy, reducing the overall circuit complexity, and improving the convenience of power supply. Therefore, the invention is suitable for application in a variety of devices.

It should be noted that the above element parameters are not limitations of the invention. A designer can fine-tune these setting values according to different requirements. The contact lens device and the communication method of the invention are not limited to the configurations of FIGS. 1-7. The invention may include any one or more features of any one or more embodiments of FIGS. 1-7. In other words, not all of the features displayed in the figures should be implemented in the contact lens device and the communication method of the invention.

The method of the invention, or certain aspects or portions thereof, may take the form of program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes an apparatus for practicing the methods. The methods may also be embodied in the form of program code transmitted over some transmission medium, such as electrical wiring or cabling, through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application-specific logic circuits.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be apparent to those skilled in the art that various modifications and variations can be made in the invention. It is intended that the standard and examples be considered as exemplary only, with a true scope of the disclosed embodiments being indicated by the following claims and their equivalents.

What is claimed is:

1. A contact lens device, comprising:
a hydrogel substrate;
a first conductive element, disposed on the hydrogel substrate;
a second conductive element, disposed on the hydrogel substrate;
an EO (Electro-Optical) crystal element, disposed between the first conductive element and the second conductive element, wherein the EO crystal element is affected by a human electric field;
a light source, transmitting an incident light signal, wherein the EO crystal element transmits back a reflected light signal according to the incident light signal;

a light waveguide, respectively guiding the incident light signal and the reflected light signal;
a light sensor, receiving the reflected light signal from the light waveguide; and
a processor, coupled to the light sensor, wherein the processor obtains relative information of the human electric field according to the reflected light signal.

2. The contact lens device as claimed in claim 1, wherein the first conductive element is surrounded by the second conductive element.

3. The contact lens device as claimed in claim 1, wherein the first conductive element substantially has a circular shape.

4. The contact lens device as claimed in claim 1, wherein the second conductive element substantially has a donut shape.

5. The contact lens device as claimed in claim 1, wherein an area of the first conductive element is greater than that of the second conductive element.

6. The contact lens device as claimed in claim 1, wherein the light source, the light waveguide, the light sensor, and the processor are integrated with the first conductive element.

7. The contact lens device as claimed in claim 1, wherein an operational frequency of the human electric field is from 10 MHz to 100 MHz.

8. The contact lens device as claimed in claim 1, wherein a refractive index of the EO crystal element is changed according to the human electric field.

9. The contact lens device as claimed in claim 1, wherein the EO crystal element is made of a lithium niobate material, a lithium tantalate material, or a barium borate material.

10. The contact lens device as claimed in claim 1, wherein the light source is an LED (Light-Emitting Diode).

11. The contact lens device as claimed in claim 1, further comprising:
an RF (Radio Frequency) transceiver, receiving or transmitting an RF signal, wherein the RF transceiver is coupled to the processor and is integrated with the first conductive element, and the processor obtains physiological information of a human body according to the RF signal.

12. The contact lens device as claimed in claim 1, wherein if a glucose eye drop falls on the contact lens device, the glucose eye drop provides electric power for the light source, the light waveguide, the light sensor, and the processor.

13. The contact lens device as claimed in claim 12, wherein a concentration of the glucose eye drop is greater than or equal to 20 mM.

14. A communication method, comprising the steps of:
providing a hydrogel substrate, a first conductive element, a second conductive element, and an EO crystal element, wherein the first conductive element and the second conductive element are disposed on the hydrogel substrate, wherein the EO crystal element is disposed between the first conductive element and the second conductive element, and wherein the EO crystal element is affected by a human electric field;
transmitting an incident light signal by a light source;
guiding the incident light signal by a light waveguide;
transmitting back a reflected light signal according to the incident light signal by the EO crystal element;
guiding the reflected light signal by the light waveguide;
receiving the reflected light signal from the light waveguide by a light sensor; and obtaining relative information of the human electric field according to the reflected light signal.

15. The communication method as claimed in claim 14, further comprising:

integrating the light source, the light waveguide, and the light sensor with the first conductive element.

16. The communication method as claimed in claim 14, further comprising:

changing a refractive index of the EO crystal element according to the human electric field.

17. The communication method as claimed in claim 14, further comprising:

receiving or transmitting an RF signal by an RF transceiver, wherein the RF transceiver is integrated with the first conductive element.

18. The communication method as claimed in claim 17, further comprising:

obtaining physiological information of a human body according to the RF signal.

19. The communication method as claimed in claim 14, further comprising:

providing electric power for the light source, the light waveguide, and the light sensor by a glucose eye drop.

20. The communication method as claimed in claim 19, wherein a concentration of the glucose eye drop is greater than or equal to 20 mM.

* * * * *